United States Patent [19]

Braden

[11] Patent Number: 5,025,114
[45] Date of Patent: Jun. 18, 1991

[54] MULTI-LAYER LEAD FRAMES FOR INTEGRATED CIRCUIT PACKAGES

[75] Inventor: Jeffrey S. Braden, Milpitas, Calif.

[73] Assignee: Olin Corporation, New Haven, Conn.

[21] Appl. No.: 429,120

[22] Filed: Oct. 30, 1989

[51] Int. Cl.⁵ .......................................... H01L 23/02
[52] U.S. Cl. .................................. 174/52.4; 357/70; 357/74
[58] Field of Search ............... 174/52.4, 52.3, 52.2, 174/52.1; 357/70, 71, 72, 74, 75, 80

[56] References Cited

U.S. PATENT DOCUMENTS

| | | |
|---|---|---|
| 3,684,818 | 8/1972 | Netherwood . |
| 4,278,784 | 7/1981 | Wong ............................... 528/27 |
| 4,320,438 | 3/1982 | Ibrahim et al. . |
| 4,461,924 | 7/1984 | Butt . |
| 4,480,262 | 10/1984 | Butt ................................. 357/74 |
| 4,513,355 | 4/1985 | Schroeder et al. . |
| 4,607,276 | 8/1986 | Butt . |
| 4,619,741 | 10/1986 | Minten et al. . |
| 4,680,613 | 7/1987 | Daniels et al. . |
| 4,721,993 | 1/1988 | Walter . |
| 4,736,236 | 4/1988 | Butt . |
| 4,761,518 | 8/1988 | Butt et al. . |
| 4,801,765 | 1/1989 | Moyer et al. . |
| 4,806,409 | 2/1989 | Walter et al. . |
| 4,814,855 | 3/1989 | Hodgson et al. . |
| 4,814,943 | 3/1989 | Okuaki ............................. 361/400 |
| 4,827,376 | 5/1989 | Voss . |
| 4,849,857 | 7/1989 | Butt et al. . |
| 4,888,449 | 12/1989 | Crane et al. ..................... 174/52.4 |
| 4,891,687 | 1/1990 | Mallik et al. ..................... 357/70 |

OTHER PUBLICATIONS

"Introducing Intel's MM Multi-Layer Molded High Performance, PQFP, 1989", Section 2.

Primary Examiner—Leo P. Picard
Assistant Examiner—Bot L. Ledynh
Attorney, Agent, or Firm—Gregory S. Rosenblatt; Paul Weinstein

[57] ABSTRACT

A composite leadframe is provided. The leadframe comprises a rigid metal portion electrically interconnected to a flexible multi-layer portion. When sealed within an electronic package, the composite leadframe provides a higher lead density than achieved by rigid metal leadframes and better electrical and mechanical properties than achieved with flexible leads. The package may comprise a discrete base and cover component with the leadframe disposed between or a monolithic block of plastic encapsulating the electronic device and a portion of the leadframe.

32 Claims, 4 Drawing Sheets

MULTI-LAYER LEAD FRAMES FOR INTEGRATED CIRCUIT PACKAGES

This invention relates to multi-layer leadframes for use in electronic packages. More particularly, the invention relates to a composite leadframe having a flexible multi-layer portion for wire bonding to an electronic device and a rigid metal portion electrically interconnected to external circuitry.

Integrated circuit devices such as silicon based semiconductor circuits are encased within a housing commonly called an electronic package. The package may comprise a base and cover component defining a cavity into which the integrated circuit is housed. Alternatively, the electronic device may be molded within a polymer resin body.

Regardless the package, a means to electrically interconnect the electronic device to external circuitry is required. Conventionally, electrical interconnection takes the form of a leadframe. The leadframe is formed from an electrically conductive material such as a copper alloy or an iron-nickel alloy. It is formed by stamping or etching into a plurality of lead fingers defining a centrally disposed aperture in which the electronic device is mounted. The ends of the lead fingers opposite the aperture extend beyond the package base for electrical interconnection to external circuitry. The leadframe is either bonded to the base and cover components or molded within the polymer resin.

Thin lead wires electrically interconnect the inner lead fingers to electrically active bonding sites on the face of the electronic device. These lead wires are about 1 mil in diameter and formed from an electrically conductive material. Aluminum, gold, copper, or alloys of those metals are usually employed. The wires are bonded to the inner lead fingers and the face of the semiconductor device by thermal compression bonding or thermosonic bonding.

A conventional leadframe is from about 5 to about factory for electronic devices requiring a limited number of connections to the external environment For example, 64 leads (32 per side) for a DIP Dual-In-Line Package leadframe and about 130 leads for a quad type leadframe is common. As integrated circuit devices become more complex, the number of bonds required increases. The bond sites are situated closer together and problems are encountered.

A conventional leadframes is from about 5 to about 20 mils thick. Due to stamping and etching considerations, the width of the lead fingers and the spacing between leads are both approximately equal to the thickness of the leadframe. Since the overall package dimensions are usually standardized the space available for lead fingers is limited. Increasing the package size is not desirable due to standardization and weight considerations.

A further limitation to lead density is the flexibility of the lead wires. Lead wire flexure is a problem. The small diameter wires may move during assembly and handling. If two of the lead wires touch, an electrical short is possible.

One solution proposed to increase lead density is multi-layer leads. The concept was initially incorporated in multi-layer ceramic packages. These packages comprise a plurality of ceramic layers with metalized circuit traces disposed between ceramic layers. Electrically conductive vias are formed through one or more ceramic layers to electrically interconnect the metalized planes. U.S. Pat. No. 4,320,438 to Ibriham et al and U.S. Pat. No 4,513,355 to Schroeder et al disclose multi-layer ceramic packages in which the lead density is increased by staggering the leads. The lead wires are bonded to a plurality of metalized sites on different vertical planes. The lead wire density is increased without increasing the potential for wire bonds shorting.

Multi-layer techniques have also been applied to conventional leadframes. For example, U.S. Pat. No. 4,680,613 to Daniels et al discloses a plastic DIP package having a ground plane separated from the leadframe by a dielectric layer. One lead is downset and spot welded to the ground plate electrically interconnecting the two conductive layers. While not increasing lead density, coupling the ground plane to the leadframe minimizes inductive resistance. Coupling permits the device to operate at higher speeds.

U.S. Pat. No. 4,801,765 to Moyer et al, discloses self-supporting leadframes separated by a dielectric material. Preferably, the upper and lower leads are interdigitated, that is the upper leads lie in the spaces between the lower leads though in a higher plane.

An article entitled "Multi-layer Molded Plastic Package" by Mallik et al appearing in an Intel brochure entitled *Introducing Intels Multi-layer Molded High Performance POFP* discloses a three metal layer leadframe. The first metal layer is a ground plane. The electronic device is bonded directly to this layer The second metal layer is a power plane. The third or top-most layer is a conventional leadframe. The three metal layers are electrically isolated by a dielectric adhesive. Lead wires extend from the electronic device to each of the three metal layers. The leadframe reduces power to ground loop inductance and reduces the capacitance of the single leads. Since the electronic device is mounted on a metal ground plane, thermal dissipation is improved reducing the operating temperature of the electronic device.

Multi-layer tape automated bonding (TAB) leads have also been disclosed. A plurality of thin metal foil layers, typically copper, are supported by a dielectric layer. A suitable dielectric layer is a polyimide such as Kapton manufactured by Dupont. The dielectric layer also electrically isolates the conductive layers. U.S. Pat. No. 3,684,818 to Netherwood discloses a two metal layer beam lead for electrically interconnecting a plurality of integrated circuit dies within a ceramic package. U.S. Pat. No. 4,814,855 to Hodgeson et al discloses a means to form multi-layer TAB structures. Bonding balls are formed on the end of beam leads. Aligned balls of different layers are bonded together with a thermode to provide electrical interconnection.

While multi-layer leadframes increase lead density and provide for better electrical performance, all the limitations of the prior art are not resolved. If conventional leadframes form a portion of the multi-layer structure, stamping and etching limitations remain. The minimum lead width and lead spacing are both about equal to the thickness of the leads. Foil leads are easily damaged during assembly and handling. When the foil leads extend beyond the polyimide support layer, lead deformation and loss of planarity is possible.

Accordingly, it is an object of the invention to provide a multi-layer leadframe which does not have the limitations of the prior art. It is a feature of the invention that the multi-layer leadframe is a composite having a TAB inner portion bonded to a rigid metal leadframe portion. It is an advantage of the present invention that the thin foil TAB leads may be etched to a finer geometry than is achievable with standard leadframes. It is a further advantage of the invention that the multi-layer TAB structure reduces impedance and signal cross talk permitting faster operating speeds. Yet another advantage of the invention is the rigid outer metal leadframe facilitates handling of the multi-layer structure. Still another advantage of the invention is that the foil leads are fully supported by a polyimide support layer. Lead deformation which is a concern when the foil leads extend beyond the support layer is eliminated.

In accordance with the invention there is provided a composite leadframe. The leadframe contains a rigid metal portion having a plurality of lead fingers extending in cantilever fashion about a centrally positioned aperture. Within this first aperture is a flexible multi-layer portion. The multi-layer portion comprises at least one metal foil layer supported by at least one dielectric layer. At least one of the metal foil layers is patterned into a plurality of circuit traces. A means is provided to individually electrically interconnect each metal foil circuit trace to a lead finger of the rigid metal lead frame portion.

The objects, features and advantages discussed above will become more apparent from the following specification and drawings in which like elements have been given like reference numbers and in which prime or multiprime numbers comprise similar elements providing similar functions.

Figure 1:
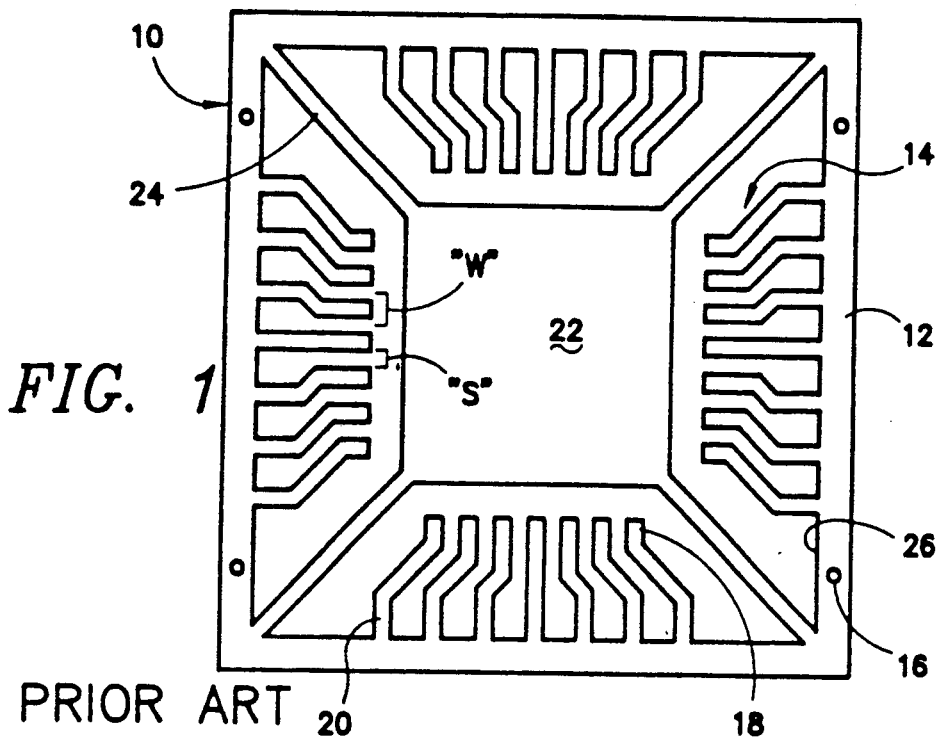
FIG. 1 illustrates in top planar view a quad leadframe as known in the prior art.

FIG. 1 illustrates in top planar view a quad leadframe 10 as known in the prior art. The leadframe 10 is formed from an electrically conductive material such as copper or a copper based alloy. For certain applications, an iron-nickel alloy such as alloy 42 (nominal composition 41% nickel, remainder iron) or Kovar (trademark for an iron-nickel-cobalt alloy) are employed to exploit the lower coefficients of thermal expansion. The leadframe 10 is usually on the order of about 10 mils (0.010 inches) thick. Although leadframe thickness of from about 5 mils to about 20 mils are used.

The leadframe 10 includes a frame 12 which generally supports the leads 14 and protects the leads from damage during handling. The frame 12 may include an indexing means 16 such as sprocket holes to facilitate automated alignment of the leads. The leads 14 have an inner lead portion 18 which may be coated with a second material such as aluminum to facilitate wire bonding to an electronic device. The opposing end of the leads 14 form the outer leads 20. Once the package is assembled, the frame 12 is severed from the leadframe 10 and the outer leads are electrically interconnected to external circuitry.

While not incorporated into every quad leadframe, many include a die attach pad 22 manufactured from the same metal strip as the leadframe 10. The die attach pad 22 is supported by pad supports 24. These supports 24 may optionally be severed during package assembly. An electronic circuit such as a silicon based semiconductor device (not shown) is mounted to the die attach pad 22 by any conventional die attach means known in the art. If the leadframe 10 is formed from a material having a relatively low coefficient of thermal expansion, a eutectic solder die attach such as gold silicon or gold tin is frequently employed. If the leadframe is copper or copper based alloy having a relatively high coefficient of thermal expansion a compliant die attach such as a silver filled epoxy adhesive or a lead tin alloy solder may be used.

The inner leads 14 are in close proximity to the electronic device to minimize bond wire lengths. Excessively long bond wires increase the likelihood of adjacent wires electrically shorting and also reduce the operating speed of the electronic device. As discussed hereinabove, due to stamping and etching considerations, the width of the inner leads 14 designated "W" in FIG. 1 must be on the order of the thickness of the leadframe or generally approximately 10 mils wide. Likewise the lead spacing designated "S" in FIG. 1 is also on the order of the thickness of the leadframe for 10 mils. Therefore, the pitch or distance from the center of one inner lead to the center of the next inner lead is 20 mils. This limits the number of leads which may be placed in close proximity to the electronic device. For example, an electronic device having peripheral dimensions of 0.400 inches by 0.400 inches would generally only support about 20 leads per side or 80 leads for a quad package.

The electronic device occupies only a fraction of the area within the frame 12. A significant portion of the available real estate is wasted. This may be seen with reference to the outer leads 20. The outer leads 20 may have the same width "W" as the inner leads 14, The space available between leads is increased significantly since the length of each inside edge 26 of the frame 12 is longer than the length of the edges of the die attach pad.

In accordance with the present invention, the inventor has provided a means to fully utilize the real estate within the frame 12 and achieve significantly higher lead count densities. This is accomplished through the use of a composite leadframe having a rigid metal leadframe portion forming the frame and outer leads and a flexible multi-layer portion forming the inner leads and the ground and power planes.

Figure 2:
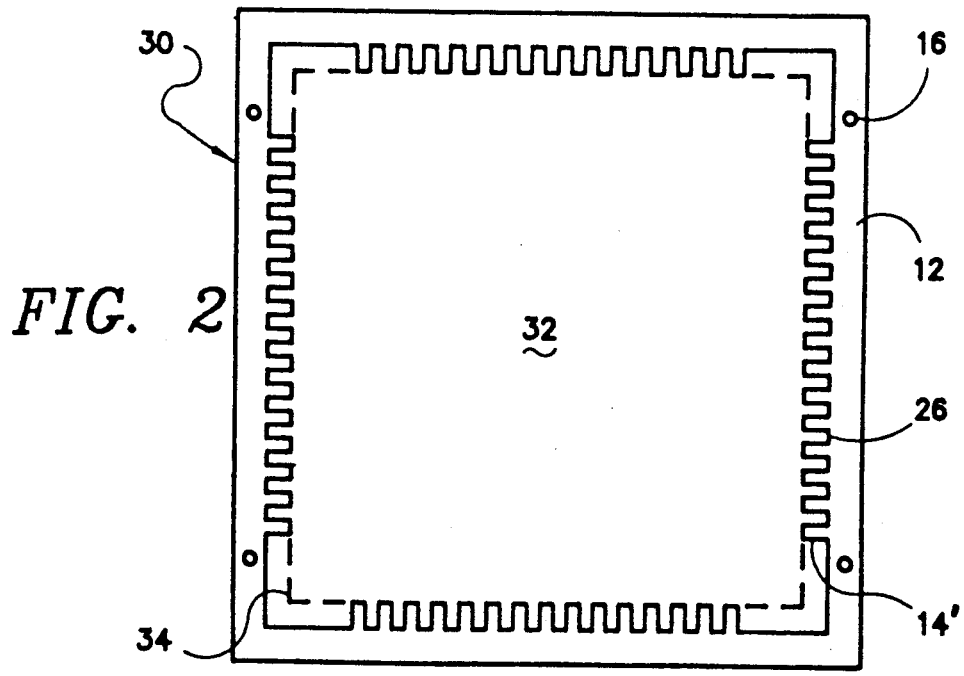
FIG. 2 illustrates in top planar view a rigid metal leadframe which forms a portion of the composite leadframe of the invention.

FIG. 2 illustrates the rigid metal leadframe portion 30 of the composite leadframe of the invention. The rigid metal portion 30 has a frame 12 and leads 14'. An indexing means 16 such as sprocket holes is optionally provided to facilitate alignment. The leads 14' comprise only the outer lead portion of the composite leadframe. The leads 14' need not be in close proximity to the electronic device. Even though the leads 14' are under the same width and spacing constraints as the leads 14 of FIG. 1, it is not necessary for the leads to remain in proximity to a centrally positioned die attach pad. The lead spacing is defined by the inside edge 26 of the frame 12.

The leads 14' are significantly shorter than the leads 14 of the prior art leadframe 10 illustrated in FIG. 1. Only the outer lead portion of the composite leadframe is manufactured from the rigid metal portion 30. The free ends of the leads 14' define a first aperture 32 as indicated by broken phantom line 34. The periphery of the aperture 32 defines the dimensions of the flexible multi-layer portion of the composite leadframe as illustrated in FIG. 3.

Figure 3:
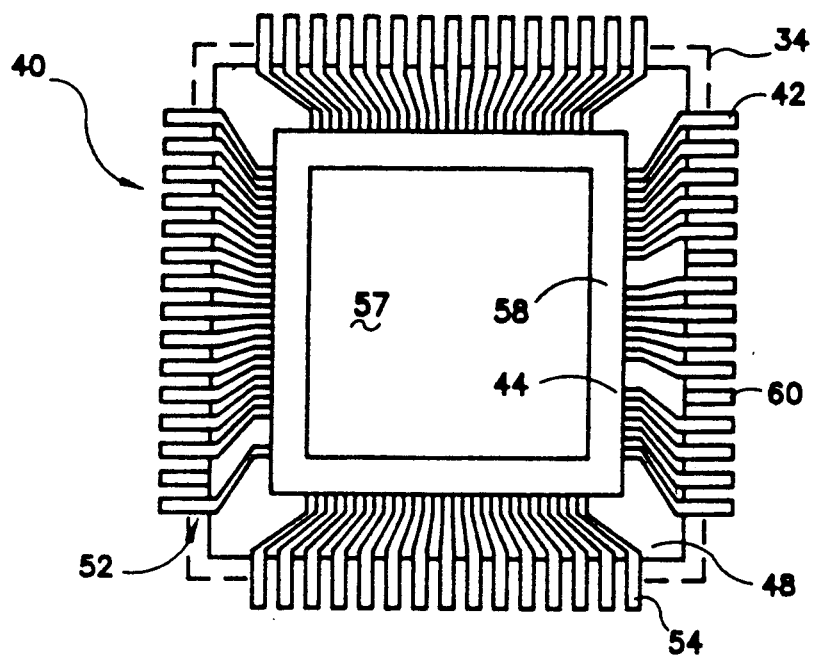
FIG. 3 illustrates in top planar view a multi-layer flexible circuit which forms a component of the composite leadframe of the invention.
Figure 4:
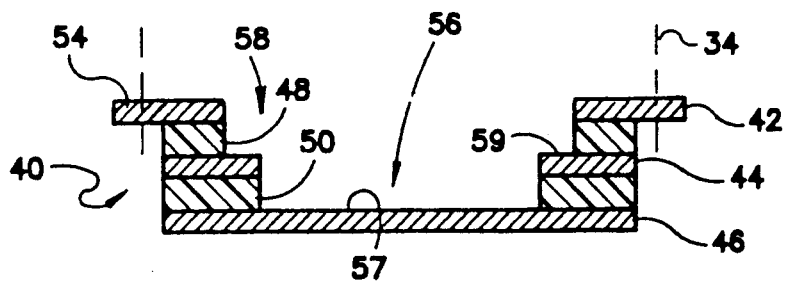
FIG. 4 shows in cross sectional representation the flexible multi-layer portion of the composite leadframe of the invention.

The flexible multi-layer portion 40 of the composite leadframe of the invention is shown in top planar view in FIG. 3, and in cross-sectional representation in FIG. 4. Phantom line 34 is illustrated to identify the positioning of the flexible multi-layer portion 40 within the aperture 32 of the rigid metal frame portion 30 as illustrated in FIG. 2. The flexible multi-layer portion 40 comprises at least one metal foil layer 42 supported by a dielectric layer such as polyimide. Preferably, a plurality of metal foil layers supported and electrically isolated from one another by dielectric layers are used. In a preferred embodiment, the multi-layer portion 40 includes a first metal foil layer 42, a second metal foil layer 44 and a third metal foil layer 46.

The metal foil layer is preferably copper or a dilute copper base alloy. The cross-sectional area of the foil circuit traces is small so the resistivity of the leads must be minimized. Preferred copper alloys have an electrical conductivity of about 100% IACS. IACS stands for *International Annealed Copper Standard* and is generally accepted to be 100% for "pure copper. Among copper alloys satisfying the conductivity requirement are C102 (Oxygen Free Copper having a nominal composition of 99.95% minimum copper by weight) and C110 (Electrolytic Tough Pitch Copper having a nominal composition of 99.90% minimum copper and 0.05% maximum by weight oxygen).

Disposed between the metal foil layers and serving to electrically isolate and bond the metal layers together are first 48 and second 50 dielectric layers. One of the metal layers is patterned into a plurality of circuit traces 52 forming the signal plane. While FIG. 3 illustrates the first metal foil layer 42 as being patterned into the signal plane and this is the embodiment described throughout this specification, nothing herein is intended to limit the signal plane to the first metal foil layer. An exterior portion 54 of the first metal foil layer 42 extends beyond the phantom line 34. The exterior portion 54 is adapted for electrical interconnection to the leads 14'.

In a first embodiment of the invention, an aperture 56 is formed through the first 42 and second 44 metal layers as well as the first 48 and second 50 dielectric layer exposing a region 57 of the third metal layer 46. An electronic device is subsequently bonded to the region 57. For most applications, the aperture 56 will be square since most semiconductor die are square. However, any aperture shape is acceptable. The third metal foil layer 46 becomes as the ground plane.

A second aperture 58 circumscribes the first aperture 56. The second aperture 58 extends through the first metal layer 42 and first dielectric layer 48. The perimeter of the second aperture is larger in both length and width than that of the first aperture so a portion 59 of the second metal foil layer 44 is exposed. The second metal foil layer 44 is patterned to include at least one exterior portion 60 extending beyond the dielectric layers and the phantom line 34. The exterior portion 60 bonds to a lead 14' of the rigid metal frame and provides a power plane.

The flexible multi-layer circuit 40 may be manufactured by a tape automated bonding procedure or by another process such as a multi-layer flexible circuit technique. One manufacturing process entails selecting first 42, second 44 and third 46 metal foil layers to be copper or a copper based alloy. The foil thickness is from about 0.0005 inches to about 0.006 inches and more preferably from about 0.0007 inches (known in the art as ½ ounce copper) to about 0.0028 inches (known in the art as 2 ounce copper). First 48 and second 50 dielectric layer are selected to be a polyimide such as Kapton manufactured by Dupont.

The first metal foil layer 42 is laminated to first dielectric layer 48. The second aperture 58 is mechanically punched through both layers. The second metal foil layer 44 is then laminated to both the first 48 and second 50 polyimide layers. The first aperture 56 is centered within the second aperture 58 by means of a mechanical punch stamped through second metal foil layer 44 and second dielectric layer 50. The third metal layer 46 is then laminated to the second dielectric layer 50 completing the structure illustrated in FIG. 4.

The third metal foil layer 46 forms the ground plane and is preferably a continuous foil sheet. Leads 42 and 60 as well as any other foil features required in any of the foil layers are patterned by photolithographic techniques as known in the art. After each metal foil layer is bonded to a dielectric layer, the unbonded side of the foil is coated with a photosensitive chemical resist. The resist is exposed to a developer such as ultraviolet light exposed through a mask containing the desired circuit pattern. Dependent on whether the photoresist is that known in the art as "positive" resist or a "negative" resist the image may be either the desired circuit pattern or a negative image. After exposure, the unexposed portion of the photoresist is removed by rinsing with an appropriate solvent exposing the underlying foil. The structure is immersed in a suitable etchant to remove the exposed copper. After etching and rinsing, the remaining photoresist is removed by a solvent wash. The dielectric layer is unaffected by the solvents and etchant. The dielectric layer remains intact and the metal foil layer is patterned into a desired configuration of circuit traces.

The foil is thin and supported by the polyimide support layer. The only limitation on lead width and lead to lead spacing is the resolution of the photolithographic process and the degree of undercutting by the etchant. Two mil wide leads with two mil wide spacing is readily achieved by photolithographic techniques and significantly finer geometries may be achieved. The inner lead pitch of the flexible multi-layer portion 40 is on the order of 3 to 4 mils as compared to about 20 mils for the leadframe of FIG. 1. The pitch differential translates into a potential five-fold increase in lead density.

Figure 5:
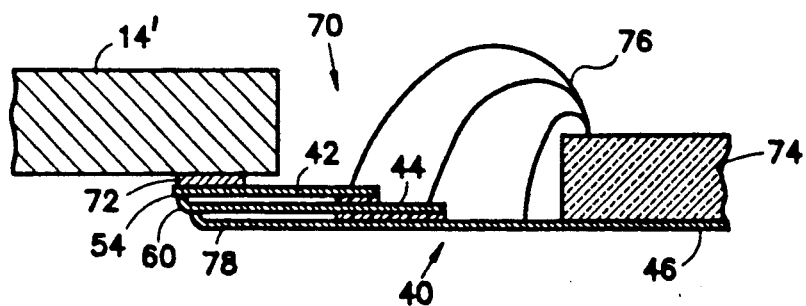
FIG. 5 illustrates in cross sectional representation the electrical interconnection between an integrated circuit and the composite leadframe of the invention.

FIG. 5 illustrates a composite leadframe 70 in accordance with a first embodiment of the invention. The leads 14' of the rigid metal frame portion are about 6 times as thick as the metal foil layers 42, 44 and 46 corresponding to 10 mil thick leads 14' and one ounce copper foil. The leads 14' of the rigid metal leadframe portion are bonded to the exterior portions of the flexible multi-layer portion. Each metal foil circuit trace is bonded to a lead finger of the rigid metal leadframe. Preferably, each exterior portion is bonded to the lead finger in closest proximity to that circuit trace. The bond 72 is either a diffusion bond made by thermocompression or thermosonic bonding or a solder such as gold-tin or lead-tin eutectic. The bonding may be single point where each flexible lead is bonded to a rigid metal lead finger 14' in sequence or gang bonding in which all the leads are simultaneously bonded.

Once the composite leadframe has been manufactured an electronic device 74 is bonded to the third metal foil layer 46. The third metal foil layer is preferably copper or a copper based alloy. The foil has a coefficient of thermal expansion approximately three times that of a silicon based integrated circuit device. To avoid thermally induced mechanical stresses, a compliant die attach material is preferably used. One exemplary die attach material is a silver filled epoxy adhesive. Lead wires 76 electrically connect the circuitry of the semiconductor device 74 to the first 42, second 44 and third 46 metal foil layers. Most lead fingers 14' are electrically interconnected to the exterior portion 54 of the first metal foil layer 42. At least one lead finger 14' is interconnected to the exterior portion 60 of the second metal foil layer 44. Likewise, at least one lead finger 14' is reserved for electrical interconnection to the exterior portion 78 of the third metal foil layer 46. The positioning of the second 44 and third 46 metal foil layer exterior portions 60, 78 is optional. The positioning is dependent on the position of the corresponding rigid lead finger 14'. Positioning is easily accomplished during photolithographic etching of the desired metal foil plane.

Figure 6:
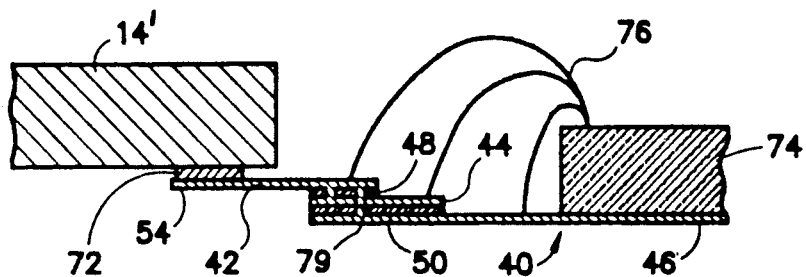
FIG. 6 illustrates in cross sectional representation a second embodiment of the electrical interconnection of an integrated circuit to the composite leadframe of the invention.

A second embodiment of the invention is illustrated in cross sectional representation in FIG. 6. In this embodiment, all electrical interconnection between the flexible multi-layer portion 40 and the rigid metal lead fingers 14' is through the exterior portion of the first metal foil layer 42. Electrically conductive vias 79 traverse one or more of the dielectric layers 48, 50. The conductive vias 79 electrically interconnect the first metal foil layer 42 to both the second 44 and third 46 metal foil layers. It is also within the scope of the invention to electrically interconnect circuit traces on the second metal foil layer 44 to regions of the third metal foil layer 46.

To form a via, a small diameter hole is formed through the dielectric layer at the point where two metal foil layers are to be electrically interconnected. The hole may be formed by a mechanical operation such as drilling, by chemical milling or by laser vaporization. The diameter of the hole is on the order of the thickness of the circuit traces 52 formed in the first metal foil layer 42, i.e. on the order of about 2 mils in diameter or larger.

The surfaces of the holes are then made electrically conductive. One means to make the holes electrically conductive is known as the BLACKHOLE TM preplating process (BLACKHOLE TM is a trademark of Olin Corporation, Stamford, Conn.). A carbon dispersion is deposited on the walls of the holes making the surfaces electrically conductive. A conductive metal such as copper is then deposited by a chemical process such as electroplating. More detail on the BLACKHOLE TM preplating process may be found in U.S. Pat. No. 4,619,741 to Minten et al. which is incorporated herein by reference.

Other known procedures for depositing a conductive layer, such as electroless deposition may also be employed.

Once the conductive vias 79 are constructed, electrical interconnection through wire bonding is effected as above. Lead wires go to first metal foil layer 42, second metal foil layer 44 and third metal foil layer 46. The conductive vias 79 transfer electrical signals from the second metal foil layer 44 and third metal foil layer 46 to circuit traces on the first metal foil layer 42. All bonds 72 between the rigid metal lead fingers 14' and the flexible portion 40 are in the same vertical plane. The likelihood of electrical short circuit between adjacent exterior portions is reduced. Further, automated assembly is facilitated.

Figure 7:
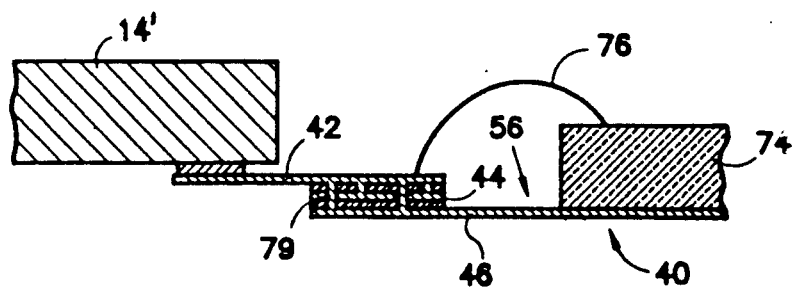
FIG. 7 illustrates in cross sectional representation the electrical interconnection of an integrated circuit to the composite leadframe in yet another embodiment of the invention.
Figure 8:
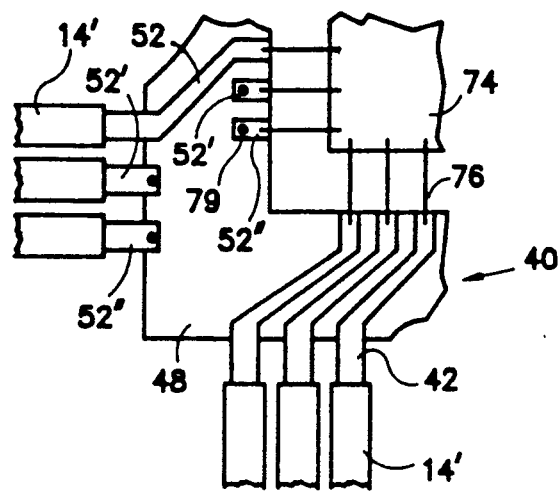
FIG. 8 illustrates in top planar view the embodiment of FIG. 7.

In yet another embodiment of the invention as illustrated in cross sectional representation in FIG. 7 and top planar view in FIG. 8, the electrically conductive vias 79 permit all lead wire 76 bonding to be to the first metal foil layer 42. A single aperture 56 is sufficient to expose the third metal foil layer 46 for die bonding. If the desired electrical interconnection is to the signal plane, the circuit trace 52 extends to a lead finger 14'. If electrical interconnection is to the power plane, electrical interconnection is to the circuit trace 52'. Circuit trace 52' is formed from the first metal layer 42 and contains a conductive via 79. The conductive via 79 transmits an electric impulse to the second metal foil layer 44 along which the impulse may travel to a second conductive via 79 where it is transmitted back to the circuit trace 52' for electrical interconnection to a lead finger 14'. Likewise, if the electrical impulse is to be a ground plane signal, electrical interconnection is to the circuit trace 52" formed from the first metal foil layer 42 which includes a conductive via 79 to transmit the signal to the third metal foil layer 46 along which the signal travels until it reaches a second conductive via 79 which transmits the signal back to the first metal foil layer 42 and circuit trace 52". Besides the advantages achieved by having all interconnection between the flexible multi-layer portion 40 and the rigid metal leadframe portion 14' in one vertical plane as detailed above. All wire bonding is to the same plane. Having all wire bonds in the same vertical plane greatly facilitates automated wire bonding.

Figure 9:
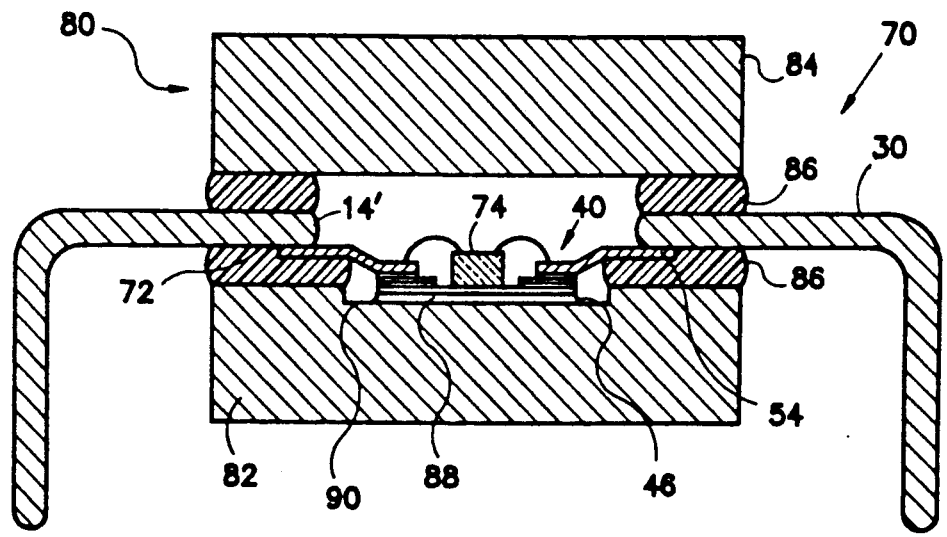
FIG. 9 illustrates in cross sectional representation the incorporation of the composite leadframe of the invention into a metal electronic package.

FIG. 9 illustrates in cross sectional representation an electronic package 80 incorporating the composite leadframe 70 of the invention. The electronic package 80 comprises a base component 82 and a cover component 84. The base component 82 and cover component 84 may be formed from any suitable material such as a metal, polymer or ceramic. Preferably, at least the base component 82 is a metal or a metal alloy to maximize thermal conductivity. Most preferably, the base component 82 is copper, aluminum or alloys thereof. In one exemplary package, the base component 82 comprises an aluminum alloy having an anodized (hydrated $Al_2O_3$) surface. The anodized surface has been found to eliminate salt spray corrosion problems and to provide electrical isolation without reducing the thermal conductivity of the package 80.

Disposed between base component 82 and cover component 84 is the composite leadframe 70. Sealant 86 bonds the leadframe 70 to both the cover component 84 and base component 82. The sealant 86 is selected to be electrically nonconductive to isolate the composite leadframe 70 from the base 82 and cover 84 components. If anodized aluminum or aluminum alloy base and cover components are provided, the anodized layer provides sufficient resistivity to negate the necessity of a nonconductive sealant. The sealant may be selected from the group consisting of thermosetting and thermoplastic polymer resins, sealing glasses and ceramics. Preferably, a thermosetting polymer resin such as an epoxy is employed. An epoxy is a preferred sealant due to its compliancy and relatively low cure temperature. Compliancy is a desired feature of the sealant 86 since the rigid metal portion 30 of a composite leadframe 70 may join to the flexible multi-layer portion 40 within the sealant. The compliant sealant supports the bond 72 without applying undue stress. A sealant 86 which bonds at a relatively low temperature is preferred since the dielectric layers of the flexible multi-layer portion 40 begin to degrade at temperatures above about 275° C.

To maximize the removal of heat from the electronic device 74, a thermally conductive adhesive 88 such as a silver filled epoxy may be used to bond the third metal foil layer 46 to a surface 90 of the base component 82.

The surface 90 of the base component 82 as illustrated in FIG. 9 shows a recess to align the bonding surface of the electronic device 74 with the composite leadframe 70. The recess is optional. A flat surface 90 is within the scope of the invention.

While the package illustrated in FIG. 9 comprises a base component 82 and a sealed cover component 84, it would be recognized by those skilled in the art that "window frame" packages are also within the scope of the invention. In a window frame type package, the composite leadframe 70 is disposed between and bonded to the base component 82 and a seal ring (not shown). The opposing side of the seal ring is subsequently bonded to a cover component 84 to complete package assembly. Window frame packages are frequently employed when package assembly and electronic device attachment are to be carried out at different locations.

While the package illustrated in FIG. 9 shows the exterior portion 54 disposed between the base component 82 and the leadframe 30, it is also within the scope of the invention for the exterior portion 54 to be disposed between the cover component 84 and the leadframe 30.

While the electronic package of FIG. 9 shows discrete base 82 and cover components 84, it should be realized that the composite leadframe of the invention may be incorporated into a molded epoxy package. Such a package in which an epoxy block encapsulates the flexible multi-layer portion 40 and at least a portion of the rigid lead fingers 14' is also within the scope of the invention.

It will be seen that with each embodiment described herein above, the lead density of the circuit traces formed in the flexible multi-layer portion 40 is significantly higher than that achieved by conventional leadframes. This is because metal foil layer is on the order of 0.0007 inches to about 0.0028 inches thick. Unlike conventional leadframes which are typically 10 mils wide with 10 mil spacing, 2 mil wide leads with 1 to 2 mil wide spacing is readily achieved by the photolithographic technique. Lead density is significantly improved over leadframes having a metal layer or multi-layer structures incorporating conventional leadframes. The outer leadframe increases the durability of the composite lead frame and facilitates wire bonding both advantages over multi-layer flexible circuits.

The patents and publication cited in this application are intended to be incorporated by reference.

It is apparent that there has been provided in accordance with this invention a composite multi-layer leadframe which fully satisfy the objects, means and the advantages set forth herein before. While the invention has been described in combination with specific embodiments thereof, it is evident that many alternatives, modifications and variations will be apparent to those skilled in the art in light of the forgoing description. Accordingly, it is intended to embrace all such alternatives, modifications and variations as fall within the spirit and broad scope of the appended claims.

I claim:

1. A composite leadframe, comprising:
   a rigid metal portion having a plurality of lead fingers extending in cantilever fashion about a centrally positioned aperture;
   a flexible multi-layer portion comprising a plurality of metal foil layers supported and electrically isolated from one another by at least one dielectric layer wherein at least a first metal layer is patterned into a plurality of circuit traces which extend within said centrally positioned aperture, and said circuit traces capable of electrical interconnection to said rigid metal portion, an electronic device or both; and
   a means for individually electrically interconnecting each of said circuit traces to a lead finger of said rigid metal portion.

2. The composite leadframe of claim 1 wherein each said circuit trace is electrically interconnected to the lead finger in closest proximity to said circuit trace.

3. The composite leadframe of claim 2 wherein said means for individually electrically interconnecting each of said circuit traces to said rigid metal portion is selected from the group consisting of a thermocompression bond, a thermosonic bond and a solder.

4. The composite leadframe of claim 3 wherein said means for individually electrically interconnecting each of said circuit traces to said rigid metal portion is said solder selected from the group consisting of gold-tin and lead-tin eutectic.

5. The composite leadframe of claim 3 wherein said flexible multi-layer portion comprises first, second and third metal foil layers, said first and second metal foil layers separated by a first dielectric layer and said second and third metal foil layers separated by a second dielectric layer.

6. The composite leadframe of claim 5 wherein said first, second and third metal foil layer are copper or a copper based alloy having a conductivity of about 100% IACS.

7. The composite leadframe of claim 6 wherein said flexible multi-layer portion includes a first aperture extending through said first and second metal foil layers and through said first and second dielectric layers, and a second aperture circumscribing said first aperture and extending through said first metal foil layer and said first dielectric layer.

8. The composite leadframe of claim 7 wherein each of said first, second and third metal foil layers have at least one exterior portion extending beyond said first and second dielectric layers for electrical interconnection to said rigid metal portion.

9. The composite leadframe of claim 7 wherein conductive vias electrically interconnect said first, second and third metal alloy foil layers.

10. The composite leadframe of claim 9 wherein said first metal foil layer includes at least one exterior portion extending beyond said first and second dielectric layers for electrical interconnection to said rigid metal portion.

11. The composite leadframe of claim 6 wherein said flexible multi-layer portion includes a first aperture extending through said first and second metal foil layers and said first and second dielectric layers.

12. The composite leadframe of claim 11 wherein said first, second and third metal foil layers are electrically interconnected by conductive vias.

13. The composite leadframe of claim 12 wherein said first metal foil layer includes at least one exterior portion extending beyond said first and second dielectric layers for electrical interconnection to said rigid metal portion.

14. A package adapted to house an electronic device, comprising: a base component;
a cover component;
a composite leadframe disposed between said base component and said cover component; and
a sealant for bonding said composite leadframe to said base component and to said cover component wherein said composite leadframe comprises a rigid metal portion having a plurality of lead fingers extending in cantilever fashion about a centrally positioned first aperture, a flexible multi-layer portion comprising a plurality of metal foil layers supported and electrically isolated from one another by at least one dielectric layer wherein at least a first metal layer is patterned into a plurality of circuit traces which extend within said centrally positioned aperture, said circuit traces capable of electrical interconnection to said rigid metal portion, an electronic device or both, and a means for individually electrically interconnecting each of said circuit traces to a lead finger of said rigid metal portion.

15. The package of claim 14 wherein each said circuit trace is electrically interconnected to the lead finger in closest proximity to said circuit trace.

16. The package of claim 15 wherein said base component and said cover component are selected from the group consisting of metals, plastics and ceramics.

17. The package of claim 16 wherein said base component is selected to be a metal or metal alloy.

18. The package of claim 17 wherein said base component is selected to be aluminum or an aluminum base alloy.

19. The package of claim 18 wherein said aluminum or aluminum based alloy base component has an anodized layer on at least those surfaces exposed to the environment.

20. The package of claim 17 wherein said sealant is selected from the group consisting of thermoplastic polymer resins, thermosetting polymer resins, sealing glasses and ceramics.

21. The package of claim 20 wherein said sealant is selected to be a thermosetting polymer resin.

22. The package of claim 21 wherein said flexible multi-layer portion includes first, second and third metal foil layers, said first and second metal foil layers separated by a first dielectric and said second and third metal foil layers separated by a second dielectric layer and first and second apertures, said first aperture extending through said first and second metal foil layers and said first and second dielectric layers and said second aperture circumscribing said first aperture and extending through said first metal foil layer and said first dielectric layer.

23. The package of claim 22 wherein said first, second and third metal foil layers each include an exterior portion extending beyond said first and second dielectric layers for electrical interconnection to said rigid metal portion.

24. The package of claim 23 wherein said first, second and third metal foil layers are electrically interconnected to said electronic device by wire bonds extending from said electronic device to said first, second and third metal foil layers.

25. The package of claim 22 wherein said first metal foil layer includes an exterior portion extending beyond said first and second dielectric layers for electrical interconnection to said rigid metal portion.

26. The package of claim 25 wherein said flexible multi-layer portion includes electrically conductive vias interconnecting said first, second and third metal foil layers.

27. The package of claim 26 wherein said first, second and third metal foil layers are electrically interconnected to said electronic device by wire bonds extending from said electronic device to said first metal foil layer.

28. The package of claim 21 wherein said flexible multi-layer portion includes a first aperture extending through said first and second metal foil layers and said first and second dielectric layers.

29. The package of claim 28 wherein said first metal foil layer includes an exterior portion extending beyond said first and second dielectric layers for electrical interconnection to said rigid metal portion.

30. The package of claim 29 wherein said flexible multi-layer portion includes electrically conductive vias interconnecting said first, second and third metal foil layers.

31. The package of claim 30 wherein said first, second and third metal foil layers are electrically interconnected to said electronic device by wire bonds extending from said electronic device to said first metal foil layer.

32. A package adapted to house an electronic device, comprising:
a composite leadframe having a rigid metal portion with a plurality of lead fingers extending in cantilever fashion about a centrally positioned first aperture, a flexible multi-layer portion comprising a plurality of metal foil layers supported and electrically isolated from one another by at least one dielectric layer wherein at least a first metal layer is patterned into a plurality of circuit traces which extend within said centrally positioned aperture, said circuit traces capable of electrical interconnection to said rigid metal portion, an electronic device or both, and a means for individually electrically interconnecting each of said circuit traces to a lead finger of said rigid metal portion; and
a molded polymer resin encapsulating said flexible multi-layer portion and at least a portion of said lead fingers.

* * * * *